(12) United States Patent
Kumagai et al.

(10) Patent No.: US 11,735,375 B2
(45) Date of Patent: Aug. 22, 2023

(54) ECS EQUIPMENT RELIABILITY THROUGH WETTING CURRENT

(71) Applicant: Honeywell International Inc., Morris Plains, NJ (US)

(72) Inventors: Gary Kumagai, Walnut, CA (US); Alan Kang, Torrance, CA (US); Amber Agnis, Chandler, AZ (US); Estevan Castellanos, Glendora, CA (US)

(73) Assignee: Honeywell International Inc., Charlotte, NC (US)

(*) Notice: Subject to any disclaimer, the term of this patent is extended or adjusted under 35 U.S.C. 154(b) by 449 days.

(21) Appl. No.: 16/931,121

(22) Filed: Jul. 16, 2020

(65) Prior Publication Data

US 2021/0253258 A1    Aug. 19, 2021

Related U.S. Application Data

(60) Provisional application No. 62/978,749, filed on Feb. 19, 2020.

(51) Int. Cl.
*H01H 1/60* (2006.01)
*B64D 13/06* (2006.01)
(Continued)

(52) U.S. Cl.
CPC .............. *H01H 1/605* (2013.01); *B64D 13/06* (2013.01); *B64D 13/08* (2013.01);
(Continued)

(58) Field of Classification Search
CPC .......... H01H 1/605; H01H 1/06; B64D 13/06; B64D 13/08; B64D 2013/0655
See application file for complete search history.

(56) References Cited

U.S. PATENT DOCUMENTS 5,135,161 A * 8/1992 Goodman .............. B64D 13/08
454/262
8,782,299 B2   7/2014 Fletcher et al.
(Continued)

OTHER PUBLICATIONS

Response to Extended Search Report dated Jun. 21, 2021, from counterpart European Application No. 21154879.7, filed Sep. 6, 2021, 24 pp.
(Continued)

*Primary Examiner* — Devon Russell
(74) *Attorney, Agent, or Firm* — Shumaker & Sieffert, P.A.

(57) ABSTRACT

This disclosure describes techniques for increasing wetting current for an electromechanical switch. In one example application, an aircraft may include one or more valves used to control the temperature of aircraft interior. The valves may include one or more valve position switches to indicate certain valve positions, e.g. fully open, fully closed, fifty percent open, and so on. In some examples, the valve position switches may receive current at electromechanical contacts of the switch that is less than the wetting current. The techniques of this disclosure provide additional wetting current at the time the switch contacts close to improve reliability of the valve position switches. In some examples, an analog to digital converter circuit may be configured to provide the additional wetting current to the switch.

20 Claims, 4 Drawing Sheets

(51) Int. Cl.
  *B64D 13/08* (2006.01)
  *H01H 1/06* (2006.01)
  *H01H 3/02* (2006.01)
  *H01H 9/16* (2006.01)
  *H03M 1/12* (2006.01)

(52) U.S. Cl.
  CPC ....... *B64D 2013/0655* (2013.01); *H01H 1/06* (2013.01); *H01H 3/02* (2013.01); *H01H 9/16* (2013.01); *H03M 1/12* (2013.01)

(56) References Cited

U.S. PATENT DOCUMENTS

| | | | |
|---|---|---|---|
| 9,057,743 B2 | 6/2015 | Alley | |
| 9,355,791 B2 | 5/2016 | Poisson | |
| 9,466,444 B2 | 10/2016 | Dickey | |
| 9,580,180 B2 | 2/2017 | Jonqueres et al. | |
| 9,746,867 B2 | 8/2017 | Hess et al. | |
| 9,837,219 B2 | 12/2017 | Jefferies | |
| 10,017,257 B2 | 7/2018 | Ludvik et al. | |
| 10,025,340 B2 | 7/2018 | Bavois | |
| 10,054,965 B2 | 8/2018 | Lucas et al. | |
| 10,101,395 B2 | 10/2018 | Edwards et al. | |
| 10,220,955 B2 | 3/2019 | Gregory et al. | |
| 10,432,412 B2 | 10/2019 | Alley et al. | |
| 10,436,843 B2 * | 10/2019 | Lovell | G01R 31/3278 |
| 10,493,820 B2 | 12/2019 | Frieling et al. | |
| 10,507,927 B2 | 12/2019 | Ludvik et al. | |
| 10,755,493 B2 | 8/2020 | Horner et al. | |
| 2014/0139015 A1 * | 5/2014 | Poisson | H01H 1/60 307/112 |
| 2016/0238658 A1 * | 8/2016 | Edwards | G01R 31/3277 |
| 2018/0186469 A1 * | 7/2018 | Gregory | B64D 13/08 |
| 2020/0070662 A1 | 3/2020 | Valls Gadea et al. | |

OTHER PUBLICATIONS

National Research Council Committee on Air Quality in Passenger Cabins of Commercial Aircraft. Chapter 2 "Environmental Control," from-The Airliner Cabin Environment and the Health of Passengers and Crew 2002, NCBI Bookshelf, accessed from https://www.ncbi.nlm.nih.gov/books/NBK207472/, on Feb. 14, 2020, 14 pp.

Honeywell International Inc., "Component Maintenance Manual, Description and Operation," 77400175, 21-60-91, Oct. 19, 2017, 4 pp.

Extended Search Report from counterpart European Application No. 21154879.7, dated Jun. 21, 2021, 10 pp.

Notice of Intent to Grant and Text Intended to Grant from counterpart European Application No. 21154879.7 dated Sep. 5, 2022, 25 pp.

* cited by examiner

ECS EQUIPMENT RELIABILITY THROUGH WETTING CURRENT

This Application claims the benefit of U.S. Provisional Patent Application 62/978,749, filed Feb. 19, 2020, the entire content of which is incorporated herein by reference.

TECHNICAL FIELD

The disclosure relates aircraft environmental control systems (ECS).

BACKGROUND

Electromechanical switches are subject to a film resistance that builds up on the electrical contacts. Film resistance may be caused, for example, by oxidation on the surface of the electrical contacts or by cycling the contacts in an environment that alternates between dry and moist conditions around the electrical contact.

SUMMARY

In general, the disclosure describes techniques for increasing the wetting current for an electromechanical switch. In one example application, an aircraft may include one or more valves used to control the temperature of aircraft interior. The valves may include one or more valve position switches to indicate certain valve positions, e.g. fully open, fully closed, fifty percent open, and so on. In some examples, the valve position switches may receive current that is not adequate to break through oxidation or other contamination on the switch contacts, as well as connectors, or wiring terminals leading to the switch contacts. The techniques of this disclosure provide additional wetting current at the time the switch contacts close to improve reliability of the valve position switches. In some examples, an analog to digital converter circuit may be configured to provide the additional wetting current to a switch, such as the valve position switch, connectors, or writing terminals leading to the switch contacts.

In one example, the disclosure describes a system comprising: a switch comprising electromechanical switch contacts; processing circuitry configured to provide a first current to the switch; a current driver circuit configured to provide a second current to the switch, wherein the switch receives a combination of the first current and the second current, and wherein the processing circuitry is configured to detect the position of the switch.

In another example, the disclosure describes an analog to digital converter (ADC) circuit comprising: an analog input terminal configured to receive a signal from a sensor; a current driver output terminal connected to a switch, wherein the switch comprises electromechanical switch contacts; a current driver circuit configured to provide a first current at the current driver output terminal, wherein the switch is configured to combine the first current and a second current such that the combined first current and the second current provide a wetting current for the switch.

In another example, the disclosure describes a method for supplying wetting current to a switch, the method comprising: receiving, by the switch, a mechanical input, wherein the mechanical input causes electromechanical contacts of the switch to close; receiving, by the switch, a first current from a controller circuit; receiving, by the switch, a second current from an analog to digital converter (ADC) circuit, wherein a combined first current and second current provides a wetting current to the electromechanical contacts of the switch.

The details of one or more examples of the disclosure are set forth in the accompanying drawings and the description below. Other features, objects, and advantages of the disclosure will be apparent from the description and drawings, and from the claims.

DETAILED DESCRIPTION

This disclosure describes techniques for increasing the wetting current for an electromechanical switch in environmental control system (ECS) equipment for aircraft. In one example application, an aircraft may include one or more valves used to control the temperature of aircraft interior. The valves may include one or more valve position switches to indicate certain valve positions, e.g. fully open, fully closed, fifty percent open, and so on. In some examples, the valve position switches may receive current that is not adequate to break through oxidation or other contamination of the switch contacts. The techniques of this disclosure provide additional wetting current at the time the switch contacts close to improve reliability of the valve position switches. In some examples, an analog to digital converter circuit may be configured to provide the additional wetting current to a switch, such as the valve position switch.

Figure 1:
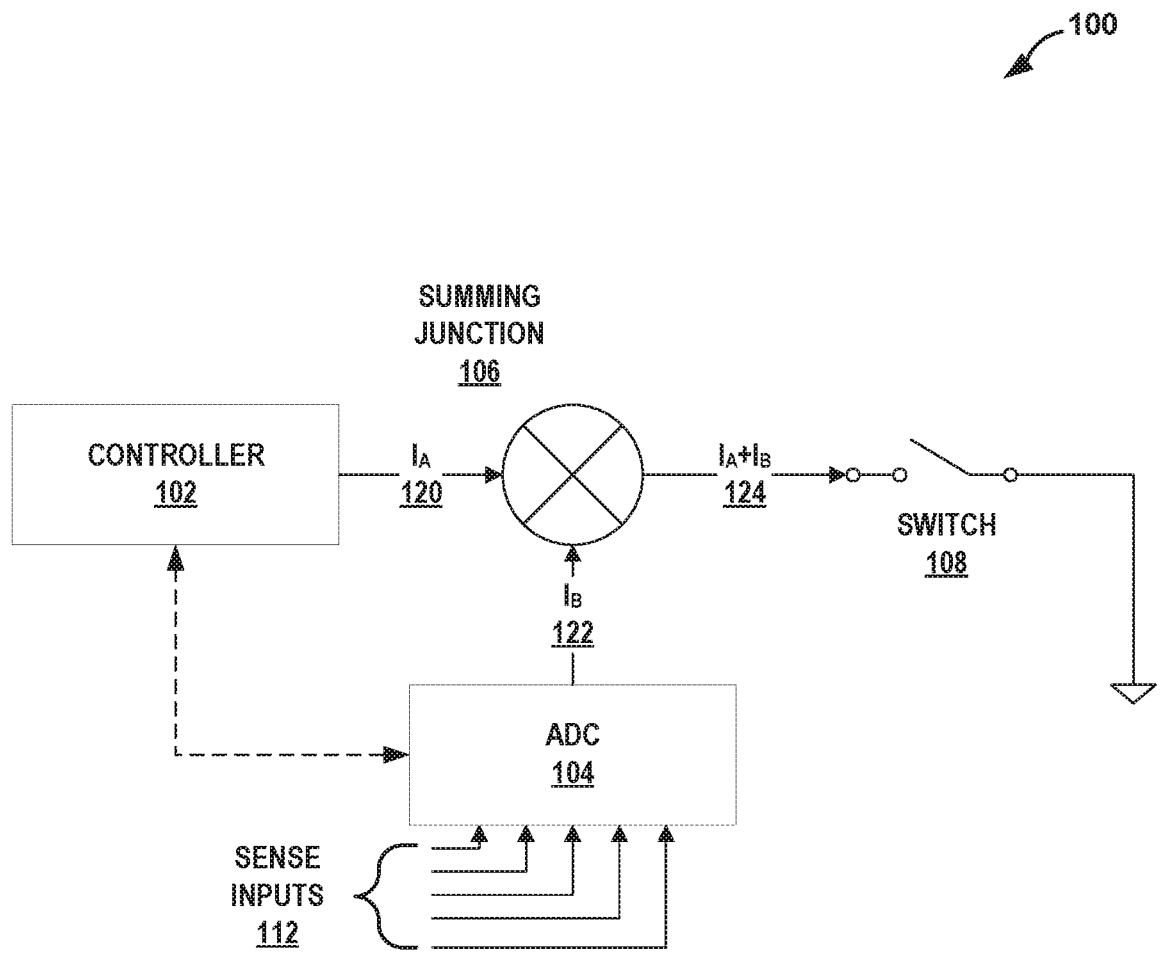
FIG. 1 is a block diagram illustrating an example system that includes a circuit to provide additional wetting current to a switch according to one or more techniques of this disclosure.

Electrical contacts may perform effectively when electrical current sent through the contacts is greater than a wetting current. Wetting current is a minimum electric current applied to a contact to break through the surface film resistance at a contact. For example, some electromechanical relays may specify a minimum load, such that the load will draw at least the minimum current to break through the film resistance. FIG. 1 is a block diagram illustrating an example system that includes a circuit to provide additional wetting current to a switch according to one or more techniques of this disclosure. System 100 may provide improved switch reliability in a variety of applications.

In the example of FIG. 1, system 100 includes controller 102, an analog to digital converter (ADC) circuit 104 and switch 108. ADC 104 may be configured to receive one or more analog signals, sense inputs 112. In some examples, system 100 may include components of an ECS that may provide air supply, thermal control, humidity control, pressurization control and so on to structures and vehicles, such as an aircraft. In some examples, sense inputs 112 may include analog signal inputs from one or more sensors that monitor performance of an environmental control system for an aircraft.

Switch 108 may include one or more electrical contacts, which may also be referred to as electromechanical switch contacts in this disclosure. When open, no current may flow through switch 108. When closed, electrical current may flow through switch 108. However, the electrical contacts of switch 108 may be subject to a film resistance. When moved from an open to a closed position, the film resistance may prevent current flow if the current is below the wetting current magnitude. Wetting current is defined in this disclosure as the magnitude of current sufficient to break through film resistance on electrical contacts to allow current to flow through switch 108. The magnitude of current sufficient to break through the film resistance may change over time. For example, at a first time, the electrical contacts of switch 108 may have only a small amount of film resistance. At a later time, the film resistance may increase, even for electrical contacts made from alloys resistant to oxidation and corrosion and contamination. Therefore, the magnitude of current sufficient to be considered wetting current may change over time. In some examples, switch 108 may be rated for a magnitude of wetting current determined to break through film oxidation under most circumstances. The rated magnitude of wetting current may be referred to as the recommended wetting current for switch 108.

Controller 102 may be configured to provide a first current, Ia 120 to switch 108. In some examples, the magnitude of Ia 120 may be less than the wetting current for switch 108. Controller 102 may perform other operations, such as controlling one or more functions of an environmental control system. Controller 102 may include processing circuitry including one or more processors, voltage and current drivers, sensor inputs and other features.

Examples of a processor in controller 102 may include any one or more of a microcontroller (MCU), e.g. a computer on a single integrated circuit containing a processor core, memory, and programmable input/output peripherals, a microprocessor (µP), e.g. a central processing unit (CPU) on a single integrated circuit (IC), a digital signal processor (DSP), an application specific integrated circuit (ASIC), a field-programmable gate array (FPGA), a system on chip (SoC) or equivalent discrete or integrated logic circuitry. A processor may be integrated circuitry, i.e., integrated processing circuitry, and that the integrated processing circuitry may be realized as fixed hardware processing circuitry, programmable processing circuitry and/or a combination of both fixed and programmable processing circuitry. Accordingly, the terms "processing circuitry," "processor" or "controller," as used herein, may refer to any one or more of the foregoing structures or any other structure operable to perform techniques described herein.

ADC 104 may receive one or more analog signals, which may include signals from sensors such as position sensors, temperature sensors, pressure sensors, light sensors, and so on. In some examples ADC 104 may be operatively coupled to controller 102. In other examples, ADC 104 may be coupled to other processing circuitry within system 100 (not shown in FIG. 1). In other examples, ADC 104 may include internal processing circuitry such as one or more processors (not shown in FIG. 1). In some examples, ADC 104 may also include one or more regulated voltage outputs (not shown in FIG. 1). ADC 104 may also include a current driver circuit configured to provide a second current, Ib 122 to switch 108. One or more of the regulated voltage outputs may be configured as the current driver circuit receive control inputs from the processing circuitry. In some examples, ADC 104 may provide Ib 122 to a node, e.g., summing junction 106. Switch 108 may receive a combination of the Ia 120 and Ib 122 from summing junction 106. ADC 104 may be configured to provide a magnitude of current Ib 122 such that the combined magnitude of current Ia+Ib 124 may at least sufficient to break through a film resistance on the electrical contacts of switch 108. In some examples the magnitude of Ia+Ib 124 may be equal to or greater than the recommended wetting current for switch 108. Use of ADC 104 to provide additional current may have advantages over other techniques because of using existing circuitry rather than including additional components or circuits to provide the current. Using existing circuitry may reduce complexity, improve reliability and reduce cost when compared to other techniques.

Figure 2:
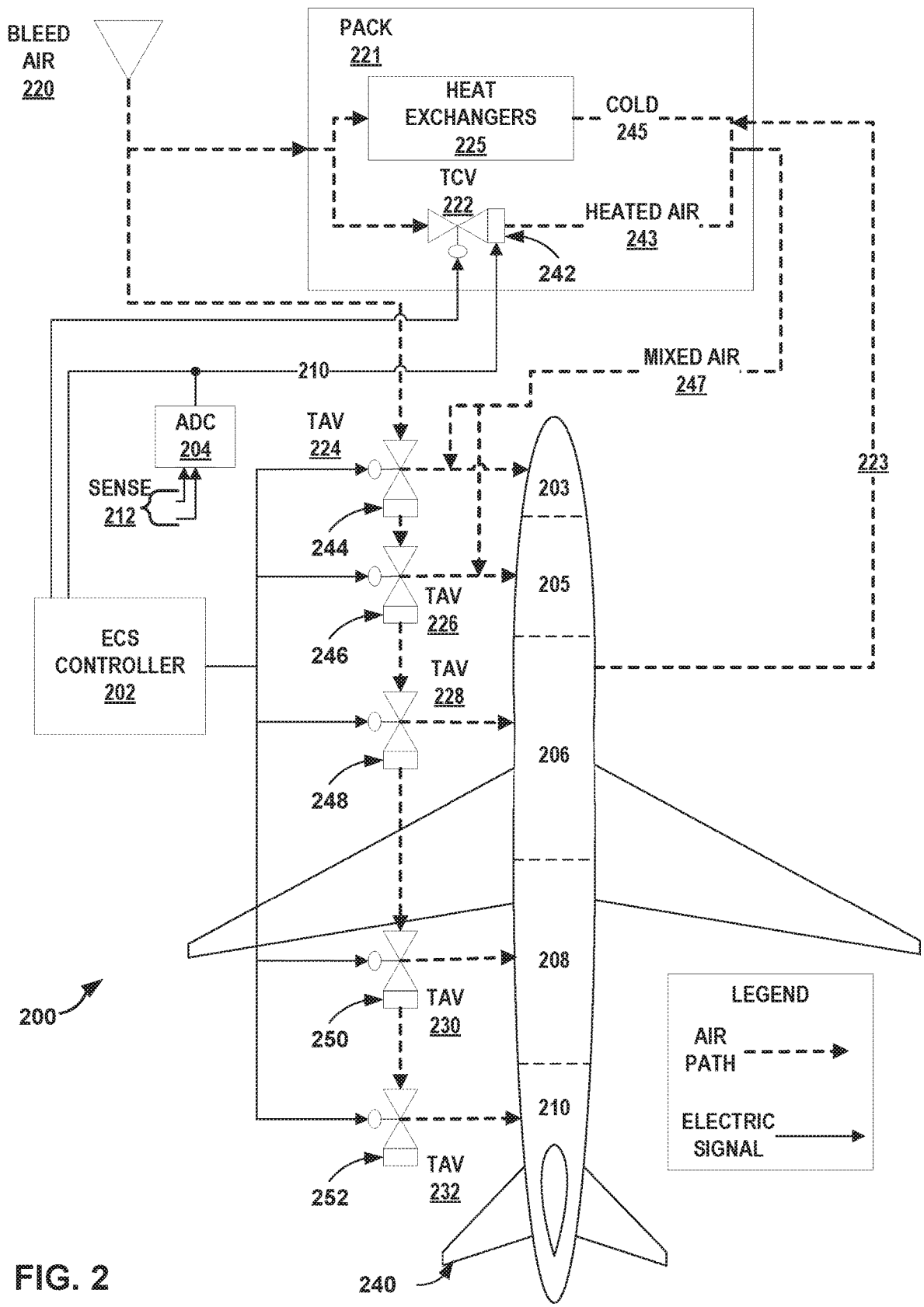
FIG. 2 is a conceptual diagram illustrating an example aircraft environmental control system that includes circuitry to provide additional wetting current to one or more valve position switches according to one or more techniques of this disclosure.

FIG. 2 is a conceptual diagram illustrating an example aircraft environmental control system (ECS) that includes circuitry to provide additional wetting current to one or more valve position sensing switches according to one or more techniques of this disclosure. ECS controller 202, ADC 204 and sense inputs 212 are examples of controller 102, ADC 104 and sense inputs 112 described above in relation to FIG. 1 and may have similar functions and characteristics, unless otherwise noted.

System 200 depicts a simplified diagram of an environmental control system with many details omitted to simplify the description of the techniques of this disclosure. In some examples, bleed air extracted from propulsion engine compressors may be supplied to one or more air-conditioning "packs" 221. The air may be is further compressed, cooled, expanded and so on in an air-cycle machine (not shown in FIG. 2) to produce low-temperature conditioned air supplied to the aircraft interior. Air 223 recirculated from the interior of the aircraft 240 may be combined with the cold pack outlet air. Aircraft 240 may also include one or more outflow valves (not shown in FIG. 2) that may automatically regulate the flow of air out of the aircraft pressure hull to the ambient environment to maintain the desired cabin, cockpit and cargo area pressure. In this disclosure, the aircraft cabin may refer to any interior portion of the aircraft, including the cockpit, aka flight deck or control center, the cargo area, passenger area, and so on. In the example of FIG. 2, system 200 includes aircraft 240 with ECS controller 202, ADC 204, bleed air supply 220, air conditioning pack 221, one or more temperature control valves, TCV 222, one or more trim air valves, TAV 226-232. TCV 222 includes one or more valve position switches 242 configured to receive current from ECS controller 202 as well as ADC 204. In the example of FIG. 2, TAVs 226-232 each also include one or more valve position switches 244-252 respectively. Valve position switches 244-252 may also be configured receive current from ECS controller 202 as well as ADC 204. However, the connections between ECS controller 202 as well as ADC 204 and valve position switches 244-252 is not shown in FIG. 2 to simplify and declutter the figure.

Temperature control valve TCV 222 is part of pack 221 and may be configured to meter the amount of hot air 243 within the pack 221 to control the outlet temperature of mixed air 247. The position of the valve in TCV 222 may control the amount of heated air 243 to control the temperature of air from TCV 222. In this disclosure, a temperature control valve may also be referred to as an air flow control valve or an air flow valve.

ECS controller 202 may send signals to TCV 222 as well as TAV 224-232 to control the position of each valve. ECS controller 202 may control the position of each valve to control the amount of heated air 243 to be mixed with cold air 245. In some examples, ECS controller 202 may control the position of each valve based on received signals from one or more sensors, such as temperature sensors.

The one or more valve position switches 242 of TCV 222 may be open or closed depending on the position of the valve. For example, a first valve position switch may close when the valve of TCV 222 is fully closed, e.g. prevent all hot air 243 from mixing with cold air 245 within the pack 221. A second valve position switch may close when the valve of TCV 222 is fully open. As described above in relation to FIG. 1, ECS controller 202 may supply valve position switches 242 with current that in some examples may not be greater than the wetting current for valve position switches 242. ADC 204 may supply a second current to valve position switches 242, that when combined with the current from ECS controller 202 is greater than the wetting current for valve position switches 242. ECS controller 202 may detect whether current flows through one of valve position switches 242. ECS controller 202 may detect the position of the valve based on whether current flows through the first switch or the second switch.

The increased current provided by ADC 204 may ensure that current flows through a switch when the switch is closed and therefore may improve the reliability of TCV 222. For example, when ECS controller 202 drives TCV 222 such that the valve should be fully closed, then ECS controller 202 may expect to detect that the first valve position switch of valve position switches 242 is closed with current flowing through the first valve position switch. The added current from ADC 204 may ensure that current flows through the switch when expected and ECS controller 202 to reliably detect the expected position of the valve of TCV 222.

Trim air valve TAV 224 is a temperature control valve that may be configured to regulate a temperature of a specified zone on the interior of the aircraft. For example, TAV 224 may be associated with zone 203, which in the example of aircraft 240 is the cockpit. In some examples, TAV 224 may regulate an amount of bleed air 220 to be mixed with air received from TCV 222 to control the temperature of zone 203. Valve position switches 244 of TAV 224 may receive current from both ECS controller 202 as well as ADC 204 and may operate as described above for valve position switches 242 of TCV 222 (not shown in FIG. 2).

Similarly, TAV 226-232 may receive bleed air 220 to regulate a respective zone within aircraft 240 via a manifold (not shown in FIG. 2 to simplify the figure). Valve position switches 246-252 may receive current from both ECS controller 202 as well as ADC 204 (not shown in FIG. 2) and may operate as described above for valve position switches 242 of TCV 222. In some examples, a second or third ADC may supply the additional current to one or more of valve position switches 246-252 (not shown in FIG. 2). Also, though shown in the example of FIG. 2, in some examples TAV 226-232 may receive mixed air 247 from TCV 222 via a manifold. In the example of FIG. 2, TAV 226 is associated with zone 205, TAV 228 is associated with zone 206, TAV 230 is associated with zone 208, and TAV 232 is associated with zone 210. TAV 226 may include valve position switches 246, TAV 228 may include valve position switches 248, TAV 230 may include valve position switches 250, and TAV 232 may include valve position switches 252.

Figure 3:
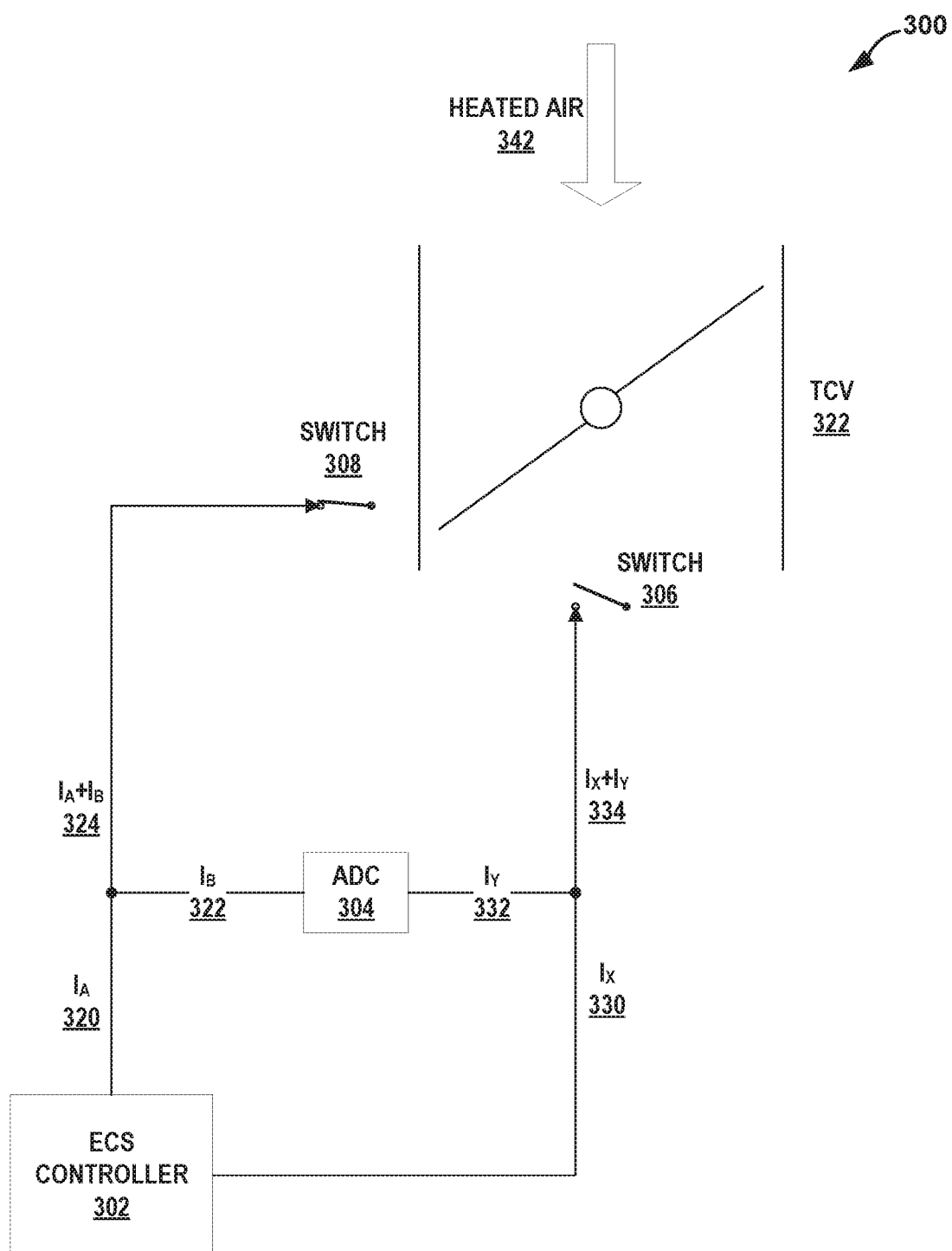
FIG. 3 is a conceptual diagram illustrating a valve including position switches that receive additional wetting current according to one or more techniques of this disclosure.
Figure 4:
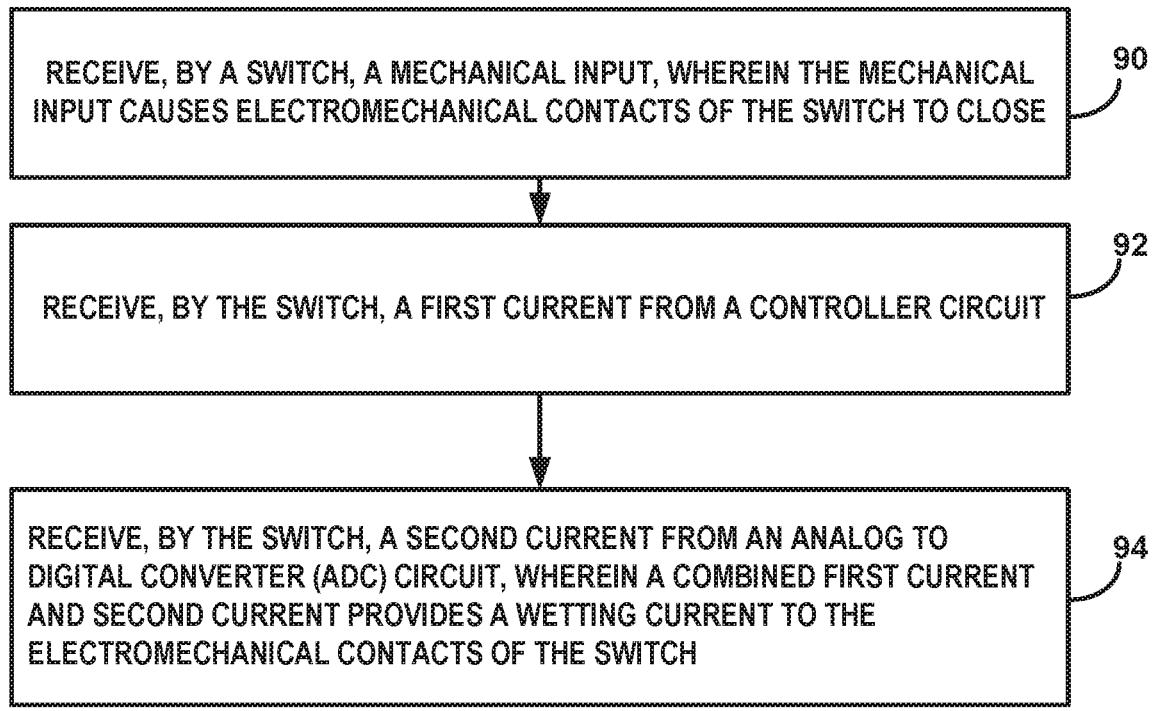
FIG. 4 is a flowchart illustrating an example operation of the system of this disclosure.

FIG. 3 is a conceptual diagram illustrating a valve including position switches that receive additional wetting current according to one or more techniques of this disclosure. System 300 is an example of systems 100 and 200 described above in relation to FIGS. 1 and 2. ECS controller 302, ADC 304, switches 306 and 308 and TCV 322 are examples of ECS controller 202, ADC 204, valve position switches 242 and TCV 222 depicted in FIG. 2.

As described above in relation to FIG. 1, ECS controller 302 may be configured to provide current, Ia 320 to switch 308. In some examples, the magnitude of Ia 320 may be less than the wetting current for switch 308. ADC 304 may include a current driver circuit configured to provide current, Ib 322 to switch 308. ADC 304 may be configured to provide a magnitude of current Ib 322 such that the combined magnitude of current Ia+Ib 324 may equal or be greater than the recommended wetting current for switch 308.

Similarly, ECS controller 302 may be configured to supply current, Ix 330 to switch 306. The magnitude of Ix 330 may be less than the wetting current for switch 306. A current driver circuit for ADC 304 may supply current, Iy 332 to switch 306 such that the combined magnitude of current Ix+Iy 334 may equal or be greater than the recommended wetting current for switch 306.

In the example of FIG. 3, switch 308 may be configured to activate, or close, when the butterfly valve of TCV 322 is in the fully closed or near closed position, which prevents heated air 342 from passing through TCV 322. In other words, switch 308 may receive a mechanical input from TCV 322. The mechanical input may cause electromechanical contacts of switch 308 to close when the butterfly valve of TCV 322 is in the fully closed or near closed position. In some examples, switch 308 may receive the mechanical input via a mechanical linkage.

Similarly, switch 306 may be configured to activate when the butterfly valve of TCV 322 is in the fully open or near open position based on a mechanical input. When the magnitude of current supplied to either switch 308 or switch 306 is less than a respective wetting current for the switch, the switch may not allow current to flow when closed. The additional current supplied by ADC 304 may ensure each respective switch receives sufficient wetting current, thereby improving reliability of position sensing for TCV 322.

In one or more examples, the functions described above may be implemented in hardware, software, firmware, or any combination thereof. For example, the various components of FIGS. 1 and 2, such as controller 102, ECS controller 202 and ADC 104 may be implemented in hardware, software, firmware, or any combination thereof. If implemented in software, the functions may be stored on or transmitted over, as one or more instructions or code, a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

The term "non-transitory" may indicate that the storage medium is not embodied in a carrier wave or a propagated signal. In certain examples, a non-transitory storage medium may store data that can, over time, change (e.g., in RAM or cache).

By way of example, and not limitation, such computer-readable storage media, may include random access memory (RAM), read only memory (ROM), programmable read only memory (PROM), erasable programmable read only memory (EPROM), electronically erasable programmable read only memory (EEPROM), flash memory, a hard disk, a compact disc ROM (CD-ROM), a floppy disk, a cassette, magnetic media, optical media, or other computer readable media. In some examples, an article of manufacture may include one or more computer-readable storage media.

Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Combinations of the above should also be included within the scope of computer-readable media.

Instructions may be executed by one or more processors, such as one or more DSPs, general purpose microprocessors, ASICs, FPGAs, or other equivalent integrated or discrete logic circuitry. Accordingly, the term "processor," as used herein, such as ECS controller 202, may refer to any of the foregoing structure or any other structure suitable for implementation of the techniques described herein. Also, the techniques could be fully implemented in one or more circuits or logic elements.

The techniques of this disclosure may be implemented in a wide variety of devices or apparatuses, including, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of interoperative hardware units, including one or more processors as described above, in conjunction with suitable software and/or firmware.

Various examples of the disclosure have been described. These and other examples are within the scope of the following claims.

What is claimed is:

1. A system for controlling a cabin temperature of an aircraft, the system comprising:
    a switch comprising electromechanical switch contacts, wherein the switch is configured to indicate a position of a temperature control valve;
    processing circuitry configured to:
       provide a first current to the switch; and
       detect a position of the temperature control valve based on the indication from the switch;
    a current driver circuit configured to provide a second current to the switch, wherein the switch receives a combination of the first current and the second current.

2. The system of claim 1, further comprising:
    an analog to digital converter (ADC) circuit, wherein the ADC circuit includes the current driver circuit configured to provide the second current to the switch.

3. The system of claim 2, wherein the ADC circuit is configured to receive one or more analog signal inputs from one or more sensors that monitor performance of an environmental control system for an aircraft.

4. The system of claim 3, the one or more sensors includes a temperature sensor.

5. The system of claim 1, wherein the processing circuitry is configured to control an environmental control system for an aircraft.

6. The system of claim 5, wherein the switch is a first switch, the system further comprising a second switch, wherein:
    the first switch is configured to indicate that the temperature control valve is closed, and
    the second switch is configured to indicate that the temperature control valve is fully open.

7. The system of claim 5,
    wherein a cabin of an aircraft comprises any one or more of an aircraft control center, cargo area, and passenger area, and
    wherein the temperature control valve is configured to add heated air to regulate a temperature on an interior of the aircraft.

8. The system of claim 7, wherein the temperature control valve comprises a trim air valve configured to regulate a temperature of a first zone on the interior of the aircraft.

9. The system of claim 1, wherein the combination of the first current and the second current provides a wetting current for the switch.

10. The system of claim 9, wherein a magnitude of the wetting current is sufficient to break through a film resistance of the electromechanical switch contacts.

11. An analog to digital converter (ADC) circuit comprising:
    an analog input terminal configured to receive a signal from a sensor;
    a current driver output terminal connected to a switch, wherein the switch comprises electromechanical switch contacts, and
       wherein the switch is configured to indicate a position of a temperature control valve;
    a current driver circuit configured to provide a first current at the current driver output terminal, wherein the switch is configured to combine the first current and a second current such that the combined first current and the second current provide a wetting current for the switch.

12. The circuit of claim 11, wherein a magnitude of the wetting current is sufficient to break through a film resistance of the electromechanical switch contacts.

13. The circuit of claim 11, wherein the switch is a first switch, the system further comprising a second switch, wherein:
    the first switch is configured to indicate that the temperature control valve is closed, and
    the second switch is configured to indicate that the temperature control valve is fully open.

14. The circuit of claim 11, wherein the temperature control valve is configured to mix heated air with cold air to regulate a temperature on an interior of an aircraft.

15. The circuit of claim 14, wherein the temperature control valve comprises a trim air valve configured to regulate a temperature of a first zone on the interior of the aircraft.

16. A method for supplying wetting current to a switch, the method comprising:
    receiving, by the switch, a mechanical input,
       wherein the mechanical input causes electromechanical contacts of the switch to close, wherein a temperature control valve provides the mechanical input, and wherein the switch provides an indication of the position of the temperature control valve;

receiving, by the switch, a first current from processing circuitry;

receiving, by the switch, a second current from an analog to digital converter (ADC) circuit, wherein a combined first current and second current provides a wetting current to the electromechanical contacts of the switch.

17. The method of claim 16, wherein the switch is a first switch, the system further comprising a second switch, wherein:

the first switch is configured to indicate that the temperature control valve is closed, and the second switch is configured to indicate that the temperature control valve is fully open.

18. The method of claim 16, wherein a magnitude of the wetting current is sufficient to break through a film resistance on the electromechanical switch contacts.

19. The method of claim 16, wherein the ADC circuit is configured to receive one or more analog signal inputs from one or more sensors that monitor performance of an environmental control system for an aircraft.

20. The method of claim 16, wherein the temperature control valve comprises a trim air valve configured to regulate a temperature of a first zone on an interior of an aircraft.

\* \* \* \* \*